US007408296B2

(12) United States Patent
Cok et al.

(10) Patent No.: US 7,408,296 B2
(45) Date of Patent: Aug. 5, 2008

(54) TILED OLED DISPLAY

(75) Inventors: Ronald S. Cok, Rochester, NY (US);
James R. Milch, Penfield, NY (US);
Andrew D. Arnold, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 524 days.

(21) Appl. No.: 10/997,449

(22) Filed: Nov. 24, 2004

(65) Prior Publication Data

US 2006/0108918 A1    May 25, 2006

(51) Int. Cl.
*H05B 33/06* (2006.01)
(52) U.S. Cl. .................................. 313/504; 345/1.3
(58) Field of Classification Search ......... 313/498–512; 315/169.3; 345/36, 45, 76, 1.3
See application file for complete search history.

(56) References Cited

U.S. PATENT DOCUMENTS

| | | | |
|---|---|---|---|
| 4,769,292 A | | 9/1988 | Tang et al. |
| 6,370,019 B1 * | | 4/2002 | Matthies et al. ............. 361/681 |
| 6,498,592 B1 | | 12/2002 | Matthies |
| 6,683,665 B1 | | 1/2004 | Matthies |
| 2004/0207315 A1 * | | 10/2004 | Robbie et al. ............... 313/504 |

FOREIGN PATENT DOCUMENTS

WO    WO 03/042968    5/2003

* cited by examiner

*Primary Examiner*—Nimeshkumar Patel
*Assistant Examiner*—Chrisotpher Raabe
(74) *Attorney, Agent, or Firm*—Frank Pincelli

(57) ABSTRACT

A passive-matrix pixel light emitting display structure and a method of making same. The display structure includes display area formed on a substrate. A set of busses is provided over the substrate that extends from an edge of the substrates across a predetermined portion of the substrate. An insulating layer is provided over the busses so that only the electrode pad and the end adjacent the edge of the bus is exposed. At least three sets of first electrode segments are located over the entire display area, each set of first electrode segments extending for only a portion of the length of the substrate and each of the first electrode segments designed to be active in a different portion of the display area. One or more layers of materials wherein at least one of which comprises light-emissive materials, is located over the first electrode segments. At least three sets of second electrode segments are located over the one or more layers of organic materials and entire display area and each set of the second electrode segments being designed to be active in a different portion of the display area. One of the three sets of second electrode segments being in contact with the exposed electrode busses, each of the first set of first electrode segments being associated with one set of the three sets of second electrode segments so as to form a plurality of display segments in the display area.

48 Claims, 5 Drawing Sheets

TILED OLED DISPLAY

FIELD OF THE INVENTION

The present invention relates to OLED flat-panel display systems composed of multiple stacked tiles.

BACKGROUND OF THE INVENTION

Electronic display systems are commonly used to display information from computers. Typical display systems range in size from small displays used in mobile devices to very large displays visible to thousands of viewers. Large displays are sometimes created from tiling smaller display devices together. For example, video walls using multiple video displays are frequently seen in the electronic media and flat-panel displays are tiled to create larger displays. Multiple projector systems used to create a large, tiled, high-resolution display are also available.

Tiled displays are well known in the prior art. For example, U.S. Pat. No. 6,683,665B1 issued Jan. 27, 2004 describes tile structures wherein each tile has a display portion and an electronics portion. The tiles are fastened together into an array with the use of a frame. Alternatively, U.S. Pat. No. 6,498,592 issued Dec. 24, 2004 describes the use of a single substrate with electrical devices and a display. However, as disclosed, these designs require the use of vias through the substrates and are problematic for displays requiring a hermetic seal for the display components, for example in an OLED display. Vias in glass substrates are difficult to construct and the use of alternative substrates are not well suited to sealing the display materials. Moreover, the design requires an additional frame and is not well suited to roll-to-roll manufacturing.

Another technique that relies on overlapping the display tiles is described in WO 03/042966 entitled "Display for a Large Panel Display Consisting of Tiled Displays". The method disclosed uses a complex support structure and a plurality of printed circuit boards. Moreover, tile seams may be visible when the display is viewed off angle.

A display may be formed on a single substrate but utilize a tiled control structure. Display elements are formed in a regular pattern across the substrate. Since each display element requires two electrodes to provide current to the display element, each display element has two electrical connections to the element. In order to conserve space on the substrate, these connections are shared wherever possible. A conventional, prior-art passive-matrix connection scheme forms a horizontal array of electrodes in one dimension and a vertical array of electrodes in a second dimension. The display elements are formed where the horizontal and vertical electrodes overlap with the light-emitting or light-controlling elements formed between the electrodes.

Using this connection scheme, only one row or column of display elements can be illuminated at once. This limitation requires that the display elements be refreshed frequently and, consequently, driven at a high frequency and with high current. The driving requirements, in turn, limit the size of the display, since electrodes that are too long or refresh frequencies that are too high, require expensive driver circuits.

A simple, well-known approach to dealing with this limitation is to divide the display elements on a single substrate into four groups, each group having its own electrode connections. For example, referring to FIG. 10, a tiled, passive-matrix, flat-panel display is formed on a single substrate 12 and divided into four groups 50, each group having a set of control signals 52. In this fashion, a larger display element matrix can be formed. However, this approach is limited to four groups and also requires the use of connections on all four sides of the substrate 12 rather than only two sides.

There is a need therefore for an improved tiled display system that overcomes the problems noted above.

SUMMARY OF THE INVENTION

In accordance with one aspect of the present invention there is provided a passive-matrix tiled OLED display structure, comprising:
 a) a substrate;
 b) one or more electrode busses located over the substrate;
 c) an insulator located over one or more of the electrode busses;
 d) two or more first electrode segments located over the insulator;
 e) one or more layers of organic materials, at least one of which comprises light-emissive materials, located over the first electrode segments, the layer(s) having openings to expose a portion of at least one of the electrode busses; and
 f) two or more second electrode segments located over the one or more layers of organic materials and in contact with the exposed portion of an electrode bus such that the one or more second electrode segments define one or more pixels in cooperation with the first electrode segments and such that at least one of the first electrode segments does not define a pixel in cooperation with at least one of the second electrode segments.

In accordance with another aspect of the present invention there is provided a passive-matrix tiled OLED display structure having a display area, comprising:
 a) a substrate;
 b) one or more electrode busses located over the substrate which extend over a predetermined portion of the substrate, each of the busses having an electrode pad and a connecting end for connecting to a controller;
 c) an insulator located over one or more of the electrode busses wherein the insulator does not cover the electrode pads;
 d) at least three sets of first electrode segments located over the entire display area, each set of first electrode segments extending for only a portion of the length of the substrate and designed to be active in a different portion of the display area;
 e) one or more layers of organic materials, at least one of which comprises light-emissive materials, located over the first electrode segments, the layer(s) having openings to expose a portion of at least one of the electrode busses; and
 f) at least three sets of second electrode segments located over the one or more layers of organic materials and entire display area and each of the sets of second electrode segments designed to be active in a different portion of the display area, one of the three sets of second electrode segments being in contact with the exposed portion electrode busses, each of the first set of first electrode segments being associated with one set of the three sets of second electrode segments so as to form a plurality of display segments in the display area.

In yet another aspect of the present invention there is provided a method of making a passive matrix tiled OLED display structure having a display area formed on a substrate comprising:

a) providing a set of busses that extend from an edge of the substrates across a predetermined portion of the substrate, each of busses having an electrode pad;

b) providing an insulating layer over the busses so that only the electrode pad and the end adjacent the edge of the bus is exposed;

c) providing at least three sets of first electrode segments located over the entire display area, each set of first electrode segments extending for only a portion of the length of the substrate and each of the first electrode segments designed to be active in a different portion of the display area;

d) providing one or more layers of organic materials, at least one of which comprises light-emissive materials, located over the first electrode segments, the layer(s) having openings to expose the electrode pads; and e) providing at least three sets of second electrode segments located over the one or more layers of organic materials and entire display area and each set of the second electrode segments being designed to be active in a different portion of the display area, one of the three sets of second electrode segments being in contact with the exposed electrode busses, each of the first set of first electrode segments being associated with one set of the three sets of second electrode segments so as to form a plurality of display segments in the display area.

In accordance with yet another aspect of the present invention there is provided a passive-matrix pixel light emitting display structure, comprising:

a) a substrate;

b) one or more electrode busses located over the substrate;

c) an insulator located over one or more of the electrode busses;

d) two or more first electrode segments located over the insulator;

e) one or more layers of materials, at least one of which comprises light emissive materials, located over the first electrode segments, the layer(s) having openings to expose a portion of at least one of the electrode busses; and f) two or more second electrode segments located over the one or more layers of organic and in contact with the exposed portion of an electrode bus such that the one or more second electrode segments define one or more pixels in cooperation with the first electrode segments and such that at least one of the first electrode segments does not define a pixel in cooperation with at least one of the second electrode segments.

In accordance with still another aspect of the present invention there is provided a passive-matrix pixel light emitting display structure having a display area, comprising:

a) a substrate;

b) one or more electrode busses located over the substrate which extend over a predetermined portion of the substrate, each of the busses having an electrode pad and a connecting end for connecting to a controller;

c) an insulator located over one or more of the electrode busses wherein the insulator does not cover the electrode pads;

d) at least three sets of first electrode segments located over the entire display area, each set of first electrode segments extending for only a portion of the length of the substrate and designed to be active in a different portion of the display area;

e) one or more layers of materials, at least one of which comprises light emissive materials, located over the first electrode segments, the layer(s) having openings to expose a portion of at least one of the electrode busses; and f) at least three sets of second electrode segments located over the one or more layers of organic materials and entire display area and each of the sets of second electrode segments designed to be active in a different portion of the display area, one of the three sets of second electrode segments being in contact with the exposed portion electrode busses, each of the first set of first electrode segments being associated with one set of the three sets of second electrode segments so as to form a plurality of display segments in the display area.

In accordance with another aspect of the present invention there is provided a method of making a passive matrix pixel light emitting display structure having a display area formed on a substrate comprising:

a) providing a set of busses that extend from an edge of the substrates across a predetermined portion of the substrate, each of busses having an electrode pad;

b) providing an insulating layer over the busses so that only the electrode pad and the end adjacent the edge of the bus is exposed;

c) providing at least three sets of first electrode segments located over the entire display area, each set of first electrode segments extending for only a portion of the length of the substrate and each of the first electrode segments designed to be active in a different portion of the display area;

d) providing one or more layers of materials, at least one of which comprises light emissive materials, located over the first electrode segments, the layer(s) having openings to expose the electrode pads; and e) providing at least three sets of second electrode segments located over the one or more layers of organic materials and entire display area and each set of the second electrode segments being designed to be active in a different portion of the display area, one of the three sets of second electrode segments being in contact with the exposed electrode busses, each of the first set of first electrode segments being associated with one set of the three sets of second electrode segments so as to form a plurality of display segments in the display area.

ADVANTAGES

The present invention has the advantage that the tiled display utilizes very simple electrical interconnections, does not require substrate vias, is simple to manufacture in a continuous process, and has improved yields.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The layers and deposited materials of the figures are not to scale, since the differences in size of the elements in the figures are too great to permit depiction at scale.

DETAILED DESCRIPTION OF THE INVENTION

According to the present invention, a passive-matrix tiled OLED display structure comprises a substrate; one or more electrode busses located over the substrate; an insulator located over one or more of the electrode busses; two or more first electrode segments located over the insulator; one or more layers of organic materials, at least one of which comprises light emissive materials, located over the first electrode segments, the layer(s) having openings to expose a portion of at least one of the electrode busses; and two or more second electrode segments located over the one or more layers of organic materials and in contact with the exposed portion of first or second electrode segments such that the one or more second electrode segments define one or more pixels in cooperation with the first electrode segments and such that at least one of the first electrode segments does not define a pixel in cooperation with at least one of the second electrode segments.

The pixels are formed where first and second electrode segments overlap. Typically, the first and second electrode segments are oriented orthogonally to each other so that the overlap between first electrode segments oriented in one direction forms a regular array of pixels with the second electrode segments formed in a second direction. Because some of the first and second electrode segments do not define pixels, the pixels can be grouped into display segments of mutually exclusive pixels whose electrode segments are not shared. In effect, each display segment forms a separate passive-matrix OLED device. Each group of mutually exclusive pixels can be independently controlled by a separate controller to control the light output from each display segment.

Figure 1:
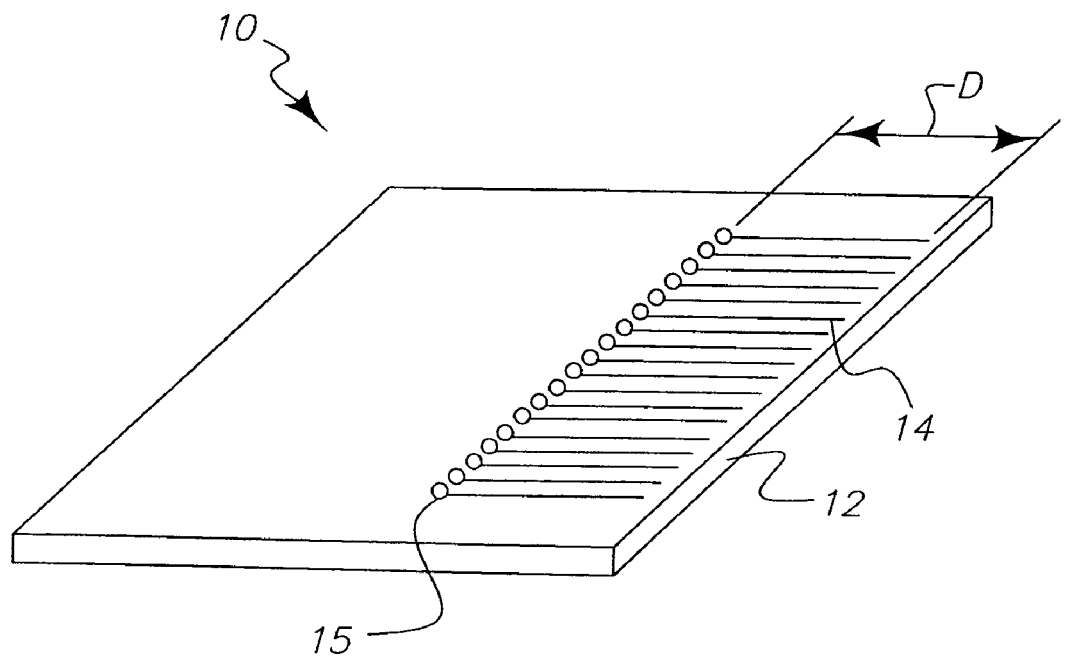
FIG. 1 is a schematic perspective view of an initial step in making a display device in accordance with the present invention illustrating a supporting substrate having cathode busses are provided.

Referring to FIGS. 1-9, there is illustrated successive steps in making a passive-matrix tiled OLED display structure according to the present invention. In FIG. 1, a display structure 10 is formed upon a substrate 12. This substrate 12 may be rigid or flexible and may comprise glass, metal, plastic, flexible glass, or flexible metal foil. One or more electrode busses 14 is formed on the substrate 12 and include an electrode pad 15. The electrode busses 14 extend across a portion of the substrate 12 a predetermined distance D.

Figure 2:
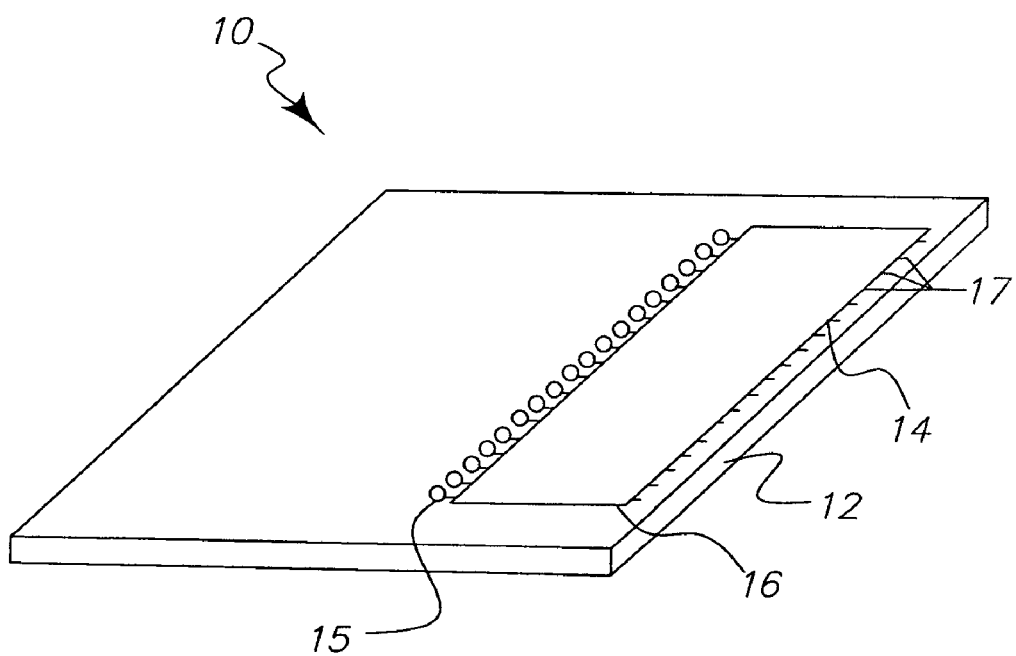
FIG. 2 is a perspective view of the display substrate of FIG. 1 with a coated insulator layer applied over the cathode busses.

Referring to FIG. 2, an insulating layer 16 is deposited over the electrode busses 14, leaving the ends 17 of the busses 14 exposed for connection to an external controller and/or power source. The electrode pad 15 is left exposed to form a connection to subsequent electrode segments to be formed. Insulating layer 16 may be formed by sputtering an insulating material, for example glass, or coating an insulating layer, for example plastic. The insulating layer 16 may comprise a plurality of layers, for example a metal layer for reducing electromagnetic radiation clad on either side with an insulating layer of plastic. Coating means for these materials are known in the art.

Figure 3:
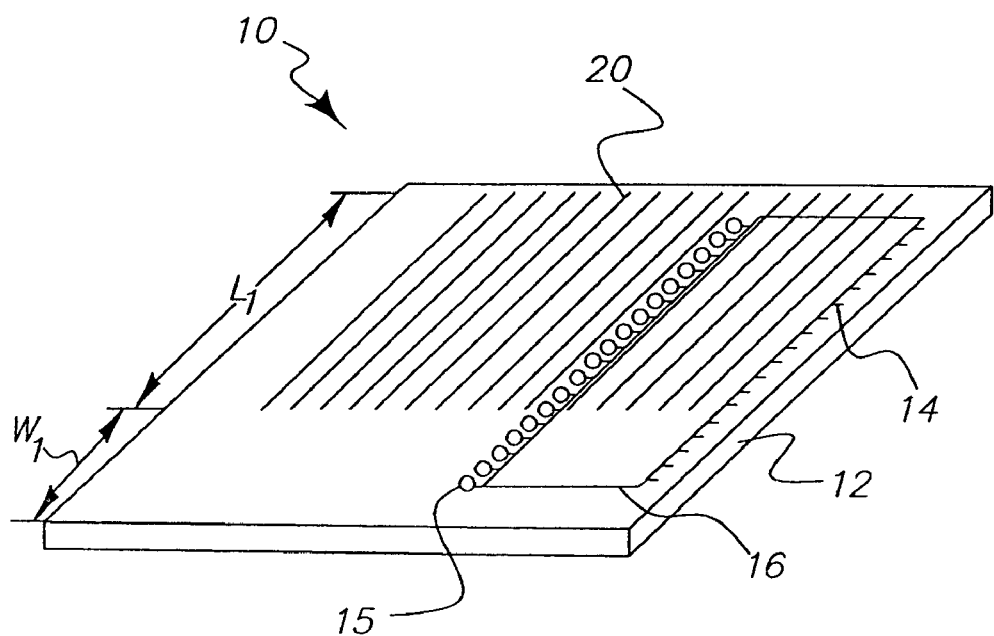
FIG. 3 is a perspective view of the display substrate of FIG. 2 with anode conductors applied to the substrate and insulating layer.

Referring to FIG. 3, there is illustrated the next step in making display structure 10. In this step a series of first electrodes segments 20 of predetermined length $l_1$ are deposited orthogonally to the electrode busses 14 and are located over the insulating layer 16 and over the substrate 12. The insulating layer 16 prevents the electrode busses 14 from contacting the first electrode segments 20 and thereby avoid creating an electrical short. The length $l_1$ is such that an open area 21 of a predetermined width $W_1$ is provided.

Figure 4:
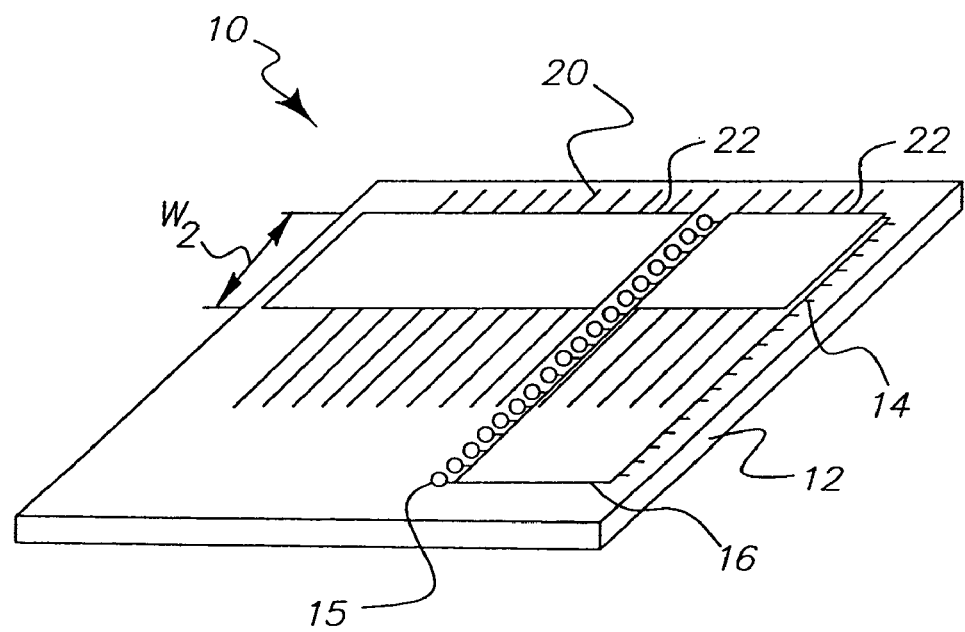
FIG. 4 is a perspective view of the display substrate of FIG. 3 with a second insulating layer applied over a portion of the anode conductors.

Referring to FIG. 4, a second layer of insulators 22 of predetermined width $W_2$ is provided over a portion of the first electrode segments 20. The insulator is formed to improve the aperture ratio of the OLED device, that is to maximize the area over the substrate 12 that can be used to form pixels. Since the electrode segments 20 take up significant space, providing an insulator 22 creates more space for pixels by allowing first electrode segments 20 to be routed under pixels rather than forcing the electrode segments 20 to be routed between the pixels.

Figure 5:
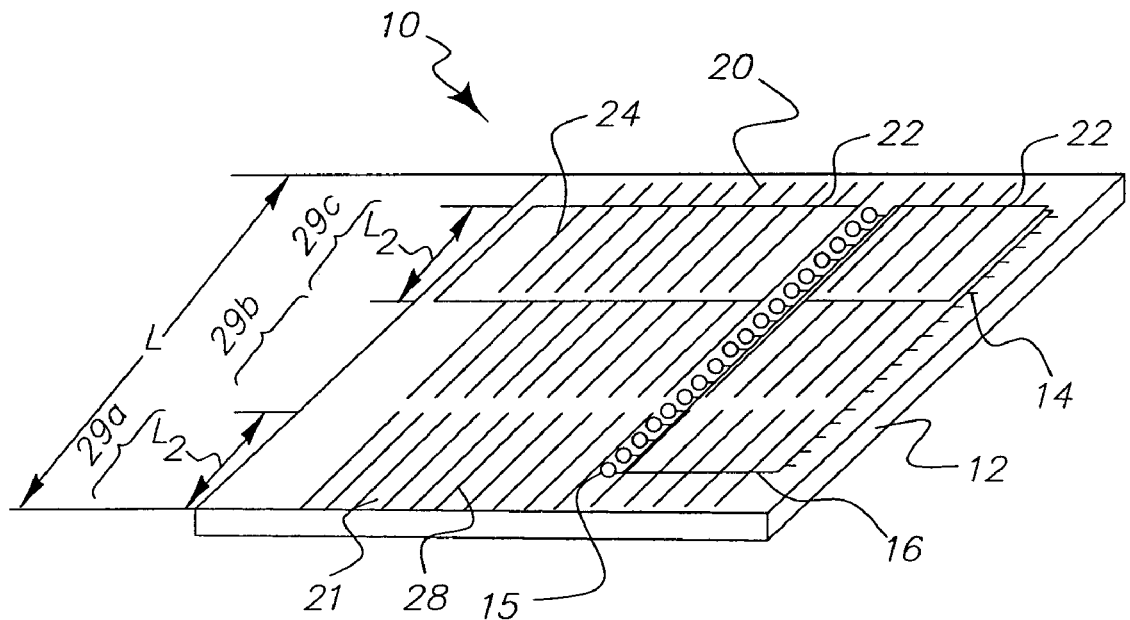
FIG. 5 is a perspective view of the display substrate of FIG. 4, illustrating the application of a second layer of anode conductors.

Referring to FIG. 5, a second layer of first electrode segments 24 and 28 are formed over the insulator 22 and over the substrate 12 in open area 21. The first electrode segments 24 having a predetermined length $l_2$ can be interdigitated with electrode segments 20 at the edge of the substrate 12 where no pixels are to be formed. The first electrode segments 24 and 28 must be formed in a regular pattern in strict alignment with each other to create a uniform display. However, the first electrode segments 20 and 24 are not continuous across the length l of the substrate 12, but instead form groups/sets of first electrode segments $29_{a,b,c}$ that assist in forming separate display segments as later discussed herein.

Figure 6:
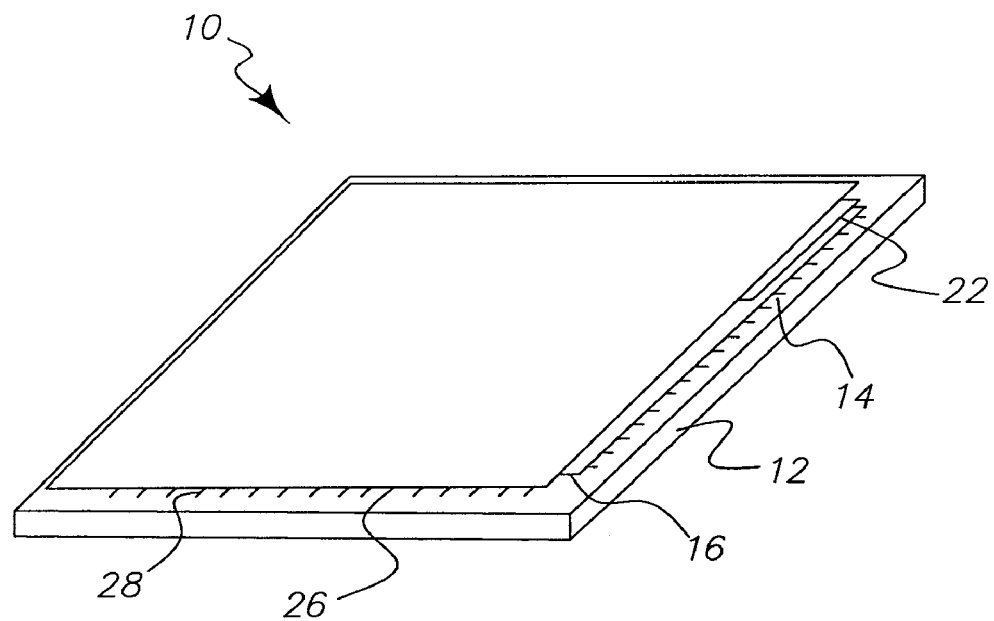
FIG. 6 is a perspective view of the display substrate of FIG. 5 with a light-emitting layer coating applied thereon.

Referring to FIG. 6, in the next step, a layer 26 of organic material is deposited over the first electrode segments 20 and 24. These layers 26 may include multiple layers of organic materials including hole-injection, hole-transporting, light-emitting, electron-transporting, and electron-injection layers. Layer 26 may be formed and deposited upon the substrate 12 using methods well-known in the art, for example using evaporative means or coating means such as spin or curtain coating to form a light-emitting area 14 on the substrate 12.

Figure 7:
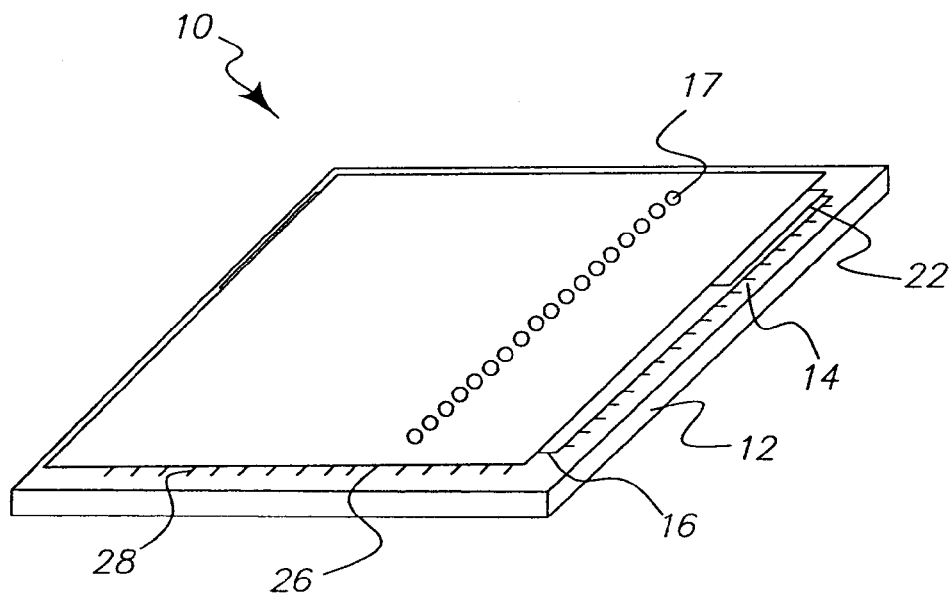
FIG. 7 is a perspective view of the display substrate of FIG. 6 with openings provided in the light-emitting layer.

Referring to FIG. 7, there is illustrated the next step of providing openings exposing the electrode pads 15. These openings may be formed by masking, by coating the electrode pads 15 so that the organic layer 26 is not deposited thereon, or by ablating the layers over the electrode pads 15 after the layer 26 is deposited. For example, U.S. application Ser. No. 10/462,360 filed Jun. 16, 2003 by Ronald S. Cok et al. describes a technique for forming openings in the layers of organic materials.

Figure 8:
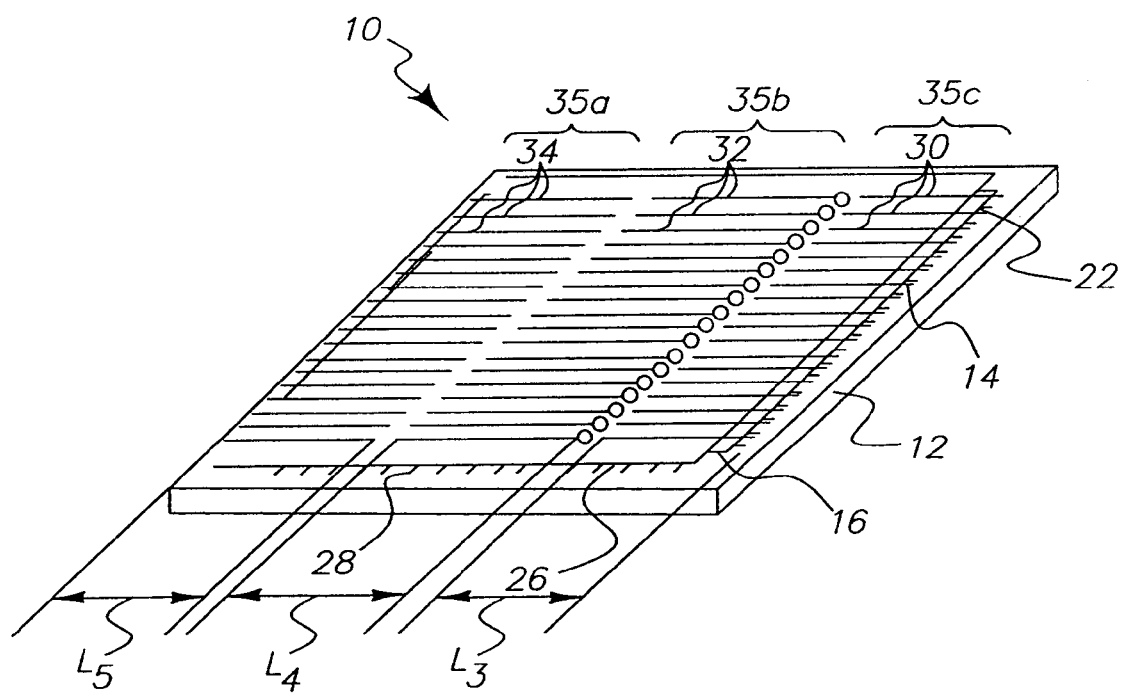
FIG. 8 is a perspective view of the display substrate of FIG. 7 with cathode conductors applied over the light emitting layer.
Figure 9:
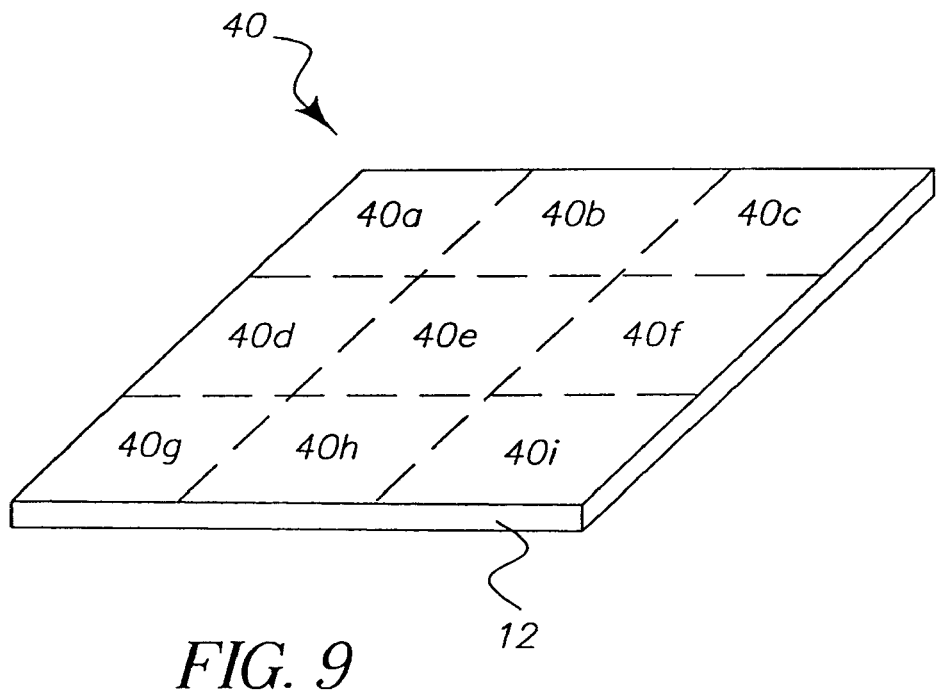
FIG. 9 illustrated various display area/sections formed in the substrate of FIG. 8.
Figure 10:
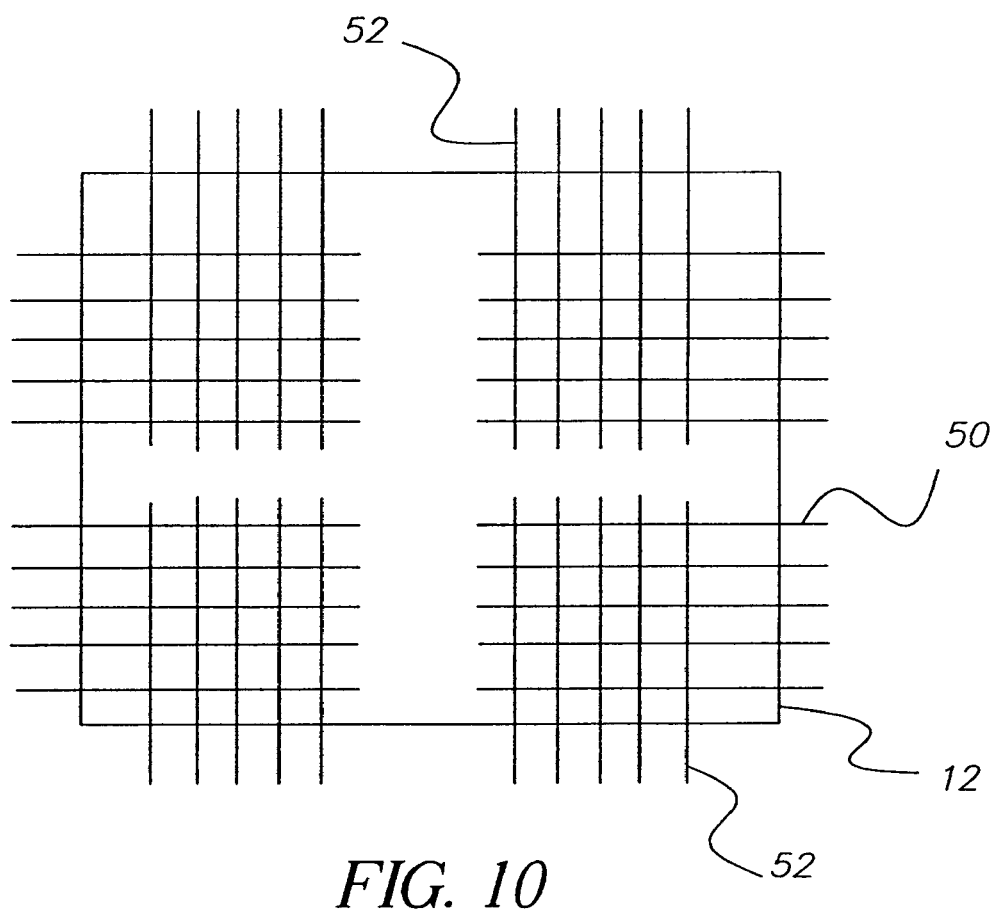
FIG. 10 illustrates a schematic view of a construction of a prior-art display device.

Referring to FIGS. 8 and 9, in a final step of fabrication, the second electrode segments 30, 32, 34 of lengths $l_3$, $l_4$, $l_5$, respectively, are deposited over the layer 26 of organic materials. The second electrode segments 30, 32, 34 are not continuous across the substrate 12. As illustrated, the electrode segments 30, 32, 34 are grouped to form sets of second electrode segments $35_{a,b,c}$ that assist sets of first electrode segments $29_{a,b,c}$ to form display segments $40_{a,b,c,d,e,f,g,h}$. As illustrated set $35_b$ of second electrode segments 32 are connected to the electrode busses 14 so that they can be connected to the controller. That is, electrode segments 32 touch contact pads 15 which in turn are connected to electrode segments 14 allowing electrode segments to activate as appropriate. The groups/sets $29_{a,b,c}$ and sets $35_{a,b,c}$ form separate independently controllable, mutually exclusive passive-matrix OLED devices.

Where the second electrode segments 30, 32, 34 and the first electrode segments 20, 24 and 28 overlap, pixels are formed that emit light upon the application of a voltage across the electrode segments. The first and second electrode segments extend, directly or by intermediate connections near to an edge of the substrate 12 where they are accessible to external connection, for example with electrical cables including wires for providing signals and power. The control for the light-emitting materials may be passive-matrix controllers connected to the conductors and electrode segments (not shown). Separate controllers and electrical connections may thus be provided for each display segments/area.

As best illustrated by FIG. 9, display segment $40_a$ is energized by applying power to segments 24 and 34; display segment $40_b$ is energized by applying power to segments 32 (through busses 14) and 24; display segment $40_c$ is energized by applying power to segments 24 and 30; display area $40_d$ is energized by applying power to segments 20 and 34; display area $40_e$ is energized by applying power to segments 20 and 32; display area $40_f$ is energized by applying power to segments 20 and 30; display area $40_g$ is energized by applying power to segments 28 and 34; display area $40h$ is energized by apply power to segments 28 and 32; and display area $40i$ is energized by applying power to segments 28 and 30.

In the preferred embodiment, the display segments $40_{a-i}$ all have the same size. This is because the various lengths $l_{1,2,3}$, $W_{1,2}$, and D and the various insulating layers have been selected to provide equal-sized display segments. However, it is to be understood the size and configuration of the various display segments may be varied to any desired size and configuration.

As is well known, passive-matrix displays are simply and inexpensively manufactured in comparison to active-matrix displays because they do not require the manufacture of active electronic components on the substrate. However, passive-matrix displays are generally limited in size, due to the increasing burden of connectors and lengthy connections as the displays grow larger. It is an object of the present invention to overcome these limitations using a tiled control structure. By employing separate controllers and connections to each display area, the present invention reduces the number and size of connections to each display area and enables larger displays, in particular passive-matrix displays, than would otherwise be possible. Moreover, the first and second electrode segments may be made much larger and more conductive than would otherwise be the case, further improving the performance of the present invention. In addition, the aperture ratio of the device is maximized. Manufacturing costs are also minimized by eliminating the need to form vias in the insulating layers or in the substrate.

The complete display may be encapsulated with a single encapsulating cover (not shown) affixed with an adhesive to the display substrate 12. Preferably, the encapsulating cover(s) are very thin to minimize the thickness of the overall display. In particular, coated encapsulating covers comprising a thin, conformal coating located over the top spaced-apart electrode are preferred.

In operation, power is provided by separate controllers (not shown) for each display area 40 through the first and second electrode segments to cause a current to flow through the OLED materials in the pixels of the display area. The current causes each pixel to light up as desired. The control and operation of OLED devices is well known in the art.

The present invention has been described in an embodiment including 9 tiles in a three-by-three array. Other arrangements are possible by providing additional insulative coatings between layers of electrode segments. For example, a four-by-four array can be formed by locating four tiles in the central area of the substrate, routing the electrode busses for each of the four tiles to each side of the substrate rather than only one side as shown in FIG. 1. Additional electrode busses may be provided over additional insulative coatings to connect the electrode tiles on the edge of the array. The first electrode busses are then formed on further insulative coatings. The second electrode segments are then coated in segments as described above and connected to the connecting pad of the electrode busses. Likewise, larger displays of, for example, 25 tiles in a five-by-five array may be made. In each case, successive layers of insulative coatings with electrode busses and first electrode segments formed over the insulative coatings enables the construction of a contiguous array of separately controllable display areas.

The present invention may be manufactured in a continuous manufacturing process wherein the display substrate and coatings are made on a continuous web.

In a preferred embodiment, the present invention is employed in a tiled flat-panel array of OLED display devices composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. However, the present invention is not so limited. Many combinations and variations of organic or non-organic pixel light-emitting displays can be used to fabricate.

The invention has been described in detail with particular reference to certain preferred embodiments thereof, but it will be understood that variations and modifications can be effected within the spirit and scope of the invention.

Parts List

| | |
|---|---|
| 10 | tiled display |
| 12 | display substrate |
| 14 | light emitting area |
| 14 | electrode busses |
| 15 | portion |
| 15 | electrode pad |
| 16 | insulating layer |
| 17 | ends |
| 20 | first electrode |
| 21 | open area |
| 22 | insulating layer |
| 24 | first electrode segments |
| 26 | organic material layers |
| 28 | first electrode |
| $29_{a,b,c}$ | first electrode segments |
| 30, 32, 34 | second electrode segments |
| $35_{a,b,c}$ | second electrode segments |
| $40_{a,b,c,d,e,f,g,h}$ | display segments |
| 50 | group |
| 52 | control signals |

What is claimed is:

1. A passive-matrix tiled OLED display structure, comprising:
   a) a substrate;
   b) one or more electrode busses extending across only a portion of the substrate and located over the substrate;
   c) an insulator located over only the substrate portion having one or more of the electrode busses and exposing a pad portion of the electrode buss;
   d) two or more first electrode segments extending at an angle to the electrode busses and located over the substrate portion having the insulator and over the substrate portion not having the insulator;
   e) one or more layers of organic materials, at least one of which comprises light emissive materials, located over the first electrode segments, the layer(s) having openings to expose the pad portion of at least one of the electrode busses; and
   f) two or more second electrode segments located parallel to the electrode busses over the one or more layers of organic materials and in contact with the exposed portion of an electrode bus such that the one or more second electrode segments define one or more pixels in cooperation with the first electrode segments and such that at least one of the first electrode segments is insulated from the at least one of the second electrode segments.

2. The passive-matrix tiled OLED display structure claimed in claim 1, further comprising first electrode segments formed over the substrate.

3. The passive-matrix tiled OLED display structure claimed in claim 1, further comprising a plurality of insulating layers.

4. The passive-matrix tiled OLED display structure claimed in claim 3, further comprising electrode busses formed over an insulating layer.

5. The passive-matrix tiled OLED display structure claimed in claim 3, further comprising first electrode segments formed over two or more of the insulating layers.

6. The passive-matrix tiled OLED display structure claimed in claim 5 wherein one or more of the first electrode segments in one layer is oriented parallel to one or more of the first electrode segments in a second layer.

7. The passive-matrix tiled OLED display structure claimed in claim 3 wherein one or more of the first electrode segments is oriented orthogonally to one or more of the electrode segments busses.

8. The passive-matrix tiled OLED display structure claimed in claim 1 wherein the second electrode segments are transparent where they define a pixel.

9. The passive-matrix tiled OLED display structure claimed in claim 1 wherein the insulating layer is glass or plastic.

10. The passive-matrix tiled OLED display structure claimed in claim 1 wherein the insulating layer is rigid or flexible.

11. The passive-matrix tiled OLED display structure claimed in claim 1 wherein the defined pixels are grouped into groups of pixels whose electrode segments are mutually exclusive.

12. The passive-matrix tiled OLED display structure claimed in claim 1, further comprising a separate controller for each mutually exclusive group of pixels to independently control the light output from each mutually exclusive group of pixels.

13. The OLED display structure claimed in claim 1 wherein the light-emitting materials are OLED materials.

14. The OLED display structure claimed in claim 1 wherein the one or more layers of organic materials include one or more layers of hole-injection material, hole-transport material, emissive material, electron-injection material, or electron-transport material.

15. The OLED display structure claimed in claim 1, further comprising an encapsulating cover located over the second electrode segments.

16. The OLED display structure claimed in claim 1 wherein the encapsulating cover is a coated layer.

17. The OLED display structure claimed in claim 1 wherein the insulating layer is coated.

18. The OLED display structure claimed in claim 1 wherein the insulating layer is sputtered.

19. The OLED display structure claimed in claim 1 wherein the openings are formed by laser ablation of the organic layers after the organic layers are deposited.

20. The OLED display structure claimed in claim 1 wherein the openings are formed by masking.

21. A passive-matrix tiled OLED display structure having a display area, comprising:
   a) a substrate;
   b) one or more electrode busses extending across only a portion of the substrate and located over the substrate which extend over a predetermined portion of said substrate, each of said busses having an electrode pad and a connecting end for connecting to a controller;
   c) an insulator located over only the substrate portion having one or more of the electrode busses wherein said insulator does not cover said electrode pads;
   d) at least three sets of first electrode segments extending at an angle to the electrode busses and located over the entire display area, each set of first electrode segments extending for only a portion of the length of said substrate and designed to be active in a different portion of the display area;
   e) one or more layers of organic materials, at least one of which comprises light emissive materials, located over the first electrode segments, the layer(s) having openings to expose the pad portion of at least one of the electrode busses; and
   f) at least three sets of second electrode segments located parallel to the electrode busses over the one or more layers of organic materials and entire display area and each of said sets of second electrode segments designed to be active in a different portion of the display area, one of said three sets of second electrode segments being in contact with the exposed portion electrode busses, each of said first set of first electrode segments being associated with one set of said three sets of second electrode segments so as to form a plurality of display segments in said display area.

22. A passive matrix tiled OLED display structure according to claim 21 wherein said plurality of display segments are identical in size.

23. A passive matrix tiled OLED display structure according to claim 22 wherein said plurality of display segments comprises nine.

24. A passive matrix tiled OLED display structure according to claim 21 wherein said first electrode segments of said second electrode segments extend orthogonal to each other.

25. A passive-matrix pixel light emitting display structure, comprising:
   a) a substrate;
   b) one or more electrode busses extending across only a portion of the substrate and located over the substrate;

c) an insulator located over only the substrate portion having one or more of the electrode busses and exposing a pad portion of the electrode buss;

d) two or more first electrode segments extending at an angle to the electrode busses and located over the substrate having the insulator and over the substrate portion not having the insulator;

e) one or more layers of materials, at least one of which comprises light emissive materials, located over the first electrode segments, the layer(s) having openings to expose the pad portion of at least one of the electrode busses; and f) two or more second electrode segments parallel to the electrode busses located over the one or more layers of organic and in contact with the exposed portion of an electrode bus such that the one or more second electrode segments define one or more pixels in cooperation with the first electrode segments and such that at least one of the first electrode segments is insulated from the at least one of the second electrode segments.

26. The passive-matrix pixel light emitting display structure claimed in claim 25, further comprising first electrode segments formed over the substrate.

27. The passive-matrix pixel light emitting display structure claimed in claim 25, further comprising a plurality of insulating layers.

28. The passive-matrix pixel light emitting display structure claimed in claim 27, further comprising electrode busses formed over an insulating layer.

29. The passive-matrix pixel light emitting display structure claimed in claim 27, further comprising first electrode segments formed over two or more of the insulating layers.

30. The passive-matrix pixel light emitting display structure claimed in claim 29 wherein one or more of the first electrode segments in one layer is oriented parallel to one or more of the first electrode segments in a second layer.

31. The passive-matrix pixel light emitting display structure claimed in claim 27 wherein one or more of the first electrode segments is oriented orthogonally to one or more of the electrode segments busses.

32. The passive-matrix pixel light emitting display structure claimed in claim 25 wherein the second electrode segments are transparent where they define a pixel.

33. The passive-matrix pixel light emitting display structure claimed in claim 25 wherein the insulating layer is glass or plastic.

34. The passive-matrix pixel light emitting display structure claimed in claim 25 wherein the insulating layer is rigid or flexible.

35. The passive-matrix pixel light emitting display structure claimed in claim 25 wherein the defined pixels are grouped into groups of pixels whose electrode segments are mutually exclusive.

36. The passive-matrix pixel light emitting display structure claimed in claim 25, further comprising a separate controller for each mutually exclusive group of pixels to independently control the light output from each mutually exclusive group of pixels.

37. The passive-matrix pixel light emitting display structure claimed in claim 25 wherein the light-emitting materials are OLED materials.

38. The passive-matrix pixel light emitting display structure claimed in claim 25 wherein the one or more layers of organic materials include one or more layers of hole-injection material, hole-transport material, emissive material, electron-injection material, or electron-transport material.

39. The passive-matrix pixel light emitting display structure claimed in claim 25, further comprising an encapsulating cover located over the second electrode segments.

40. The passive-matrix pixel light emitting display structure claimed in claim 25 wherein the encapsulating cover is a coated layer.

41. The passive-matrix pixel light emitting display structure claimed in claim 25 wherein the insulating layer is coated.

42. The passive-matrix pixel light emitting display structure claimed in claim 25 wherein the insulating layer is sputtered.

43. The passive-matrix pixel light emitting display structure claimed in claim 25 wherein the openings are formed by laser ablation of the organic layers after the organic layers are deposited.

44. The passive-matrix pixel light emitting display structure claimed in claim 25 wherein the openings are formed by masking.

45. A passive-matrix pixel light emitting display structure having a display area, comprising:

a) a substrate;

b) one or more electrode busses extending across only a portion of the substrate and located over the substrate which extend over a predetermined portion of said substrate, each of said busses having an electrode pad and a connecting end for connecting to a controller;

c) an insulator located over only the substrate portion having one or more of the electrode busses wherein said insulator does not cover said electrode pads;

d) at least three sets of first electrode segments located over the entire display area, each set of first electrode segments extending for only a portion of the length of said substrate and designed to be active in a different portion of the display area;

e) one or more layers of materials, at least one of which comprises light emissive materials, located over the first electrode segments, the layer(s) having openings to expose the pad portion of at least one of the electrode busses; and f) at least three sets of second electrode segments located over the one or more layers of organic materials and entire display area and each of said sets of second electrode segments designed to be active in a different portion of the display area, one of said three sets of second electrode segments being in contact with the exposed portion electrode busses, each of said first set of first electrode segments being associated with one set of said three sets of second electrode segments so as to form a plurality of display segments in said display area.

46. A passive matrix pixel light emitting display structure according to claim 45 wherein said plurality of display segments are identical in size.

47. A passive matrix pixel light emitting display structure according to claim 46 wherein said plurality of display segments comprises nine.

48. A passive matrix pixel light emitting display structure according to claim 45 wherein said first electrode segments of said second electrode segments extend orthogonal to each other.

* * * * *